(12) United States Patent
Chen

(10) Patent No.: US 12,408,264 B2
(45) Date of Patent: Sep. 2, 2025

(54) LAYOUT OF SIGNAL TRACES

(71) Applicant: REALTEK SEMICONDUCTOR CORPORATION, Hsinchu (TW)

(72) Inventor: Yung-Chung Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 196 days.

(21) Appl. No.: 18/206,101

(22) Filed: Jun. 6, 2023

(65) Prior Publication Data

US 2023/0403786 A1 Dec. 14, 2023

(30) Foreign Application Priority Data

Jun. 10, 2022 (TW) .................................. 111121682

(51) Int. Cl.
*H05K 1/02* (2006.01)

(52) U.S. Cl.
CPC ......... *H05K 1/0245* (2013.01); *H05K 1/0219* (2013.01); *H05K 1/0251* (2013.01); *H05K 2201/09236* (2013.01)

(58) Field of Classification Search
None
See application file for complete search history.

(56) References Cited

U.S. PATENT DOCUMENTS 3,757,028 A * 9/1973 Schlessel ............. H05K 1/0228
174/262
5,036,160 A * 7/1991 Jackson ............... H05K 9/0039
174/262
8,553,364 B1 * 10/2013 Schreiber ............... G11B 5/486
360/245.9
2012/0243184 A1 9/2012 Lee
2015/0364418 A1 12/2015 Leong

OTHER PUBLICATIONS

OA letter of a counterpart TW application (appl. No. 111121682) mailed on Sep. 4, 2023. Summary of the TW OA letter issued according to the TW counterpart application: (1) Claims 1-10 are rejected as being unpatentable over the cited reference 1 (US 2012/0243184A1) in view of the cited reference 2 (US 2015/0364418A1). P.S. Correspondence between the claims of the TW counterpart application and the claims of the present US application:(1) Claims 1-8, 9, and 10 of the TW counterpart application are corresponding to the claims 1-8, 14 and 16 of the present US application respectively.

* cited by examiner

*Primary Examiner* — Timothy J Thompson
*Assistant Examiner* — John B Freal
(74) *Attorney, Agent, or Firm* — WPAT, PC (57) ABSTRACT

A layout of signal traces includes a first set of signal traces and a second set of signal traces that are used for transmitting a first differential signal and a second differential signal respectively. Each set of signal traces includes a first part, a second part, and a third part along the direction of signal transmission. Different parts of the same signal trace as a whole is not straight. All the first parts are in a first signal layer and parallel. The second parts of the two sets of signal traces are in a second signal layer and the first signal layer, respectively, and are across each other. The second part of the first/second set of signal traces is coupled with the first and third parts of the first/second set of signal traces. All the third parts are in the first signal layer and parallel.

11 Claims, 5 Drawing Sheets

LAYOUT OF SIGNAL TRACES

BACKGROUND OF THE INVENTION

1. Field of the Invention

The present disclosure relates to a layout of signal traces, especially to a layout of signal traces applicable to the transmission of multiphase signals.

2. Description of Related Art

In the field of wired or wireless communication, multiphase signals are very common. For example, a general radio frequency (RF) receiver performs the following operations: after receiving an RF signal, amplifying the RF signal with a low noise amplifier and then transmitting the RF signal to a mixer; using the mixer to down-convert the RF signal into four intermediate frequency (IF) signals according to four oscillation signals from a local oscillator, respectively, wherein the four IF signals have their respective phases because the four oscillation signals have their respective phases (e.g., four kinds of phases: 0 degree, 180 degrees, 90 degrees, and 270 degrees) and the frequency of each IF signal is equal to the frequency of the RF signal minus the frequency of the oscillation signal (hereinafter referred to as "the LO frequency"); and then using a baseband circuit to receive and process the four IF signals. The four oscillation/IF signals having their respective phases are transmitted over traces on a circuit board and/or traces of an integrated circuit (IC).

Figure 1:
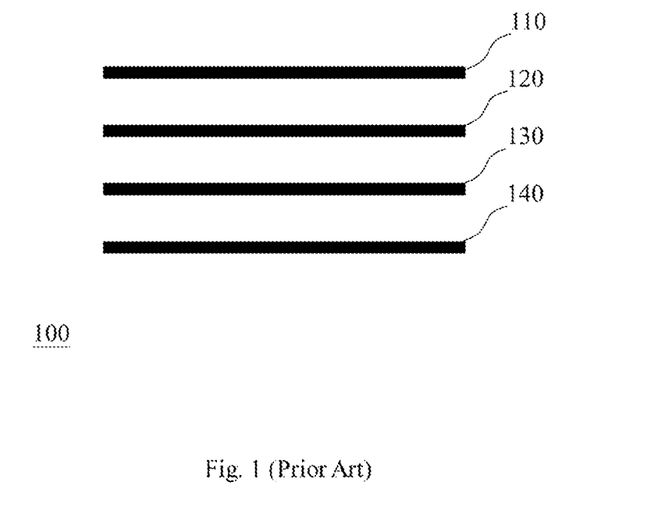
FIG. 1 shows a conventional trace layout.

FIG. 1 shows a conventional trace layout 100 including four signal traces 110, 120, 130, and 140. These signal traces 110, 120, 130, and 140 are used for transmitting the four oscillation/IF signals with the four kinds of phases, respectively. However, the trace layout 100 is inclined to generate radiation which interferes with peripheral circuits; normally, when the LO frequency of an oscillation signal generated by a local oscillator is high, this LO frequency and its harmonic frequency induce the most serious interference. The harmonic frequency is K times the LO frequency (e.g., two times the LO frequency), wherein the K is a positive integer.

SUMMARY OF THE INVENTION

An object of the present disclosure is to provide a layout of signal traces as an improvement over the prior art.

An object of the present disclosure is to provide a layout of signal traces applicable to the transmission of multiphase signals and capable of reducing radiation interference.

A first embodiment of the layout of signal traces of the present disclosure includes a first set of signal traces and a second set of signal traces. The first set of signal traces includes a first signal trace and a second signal trace. The second set of signal traces includes a third signal trace and a fourth signal trace. The first signal trace, the second signal trace, the third signal trace, and the fourth signal trace are used for transmitting a first signal, a second signal, a third signal, and a fourth signal respectively, wherein the first signal and the second signal jointly form a first differential signal, the third signal and the fourth signal jointly form a second differential signal, and the first differential signal is different from the second differential signal.

Regarding the first embodiment, the first signal trace includes a first-signal first line segment, a first-signal second line segment, and a first-signal third line segment in sequence along the transmission direction of the first signal; and the second signal trace includes a second-signal first line segment, a second-signal second line segment, and a second-signal third line segment in sequence along the transmission direction of the second signal. The first-signal first line segment and the second-signal first line segment are in a first signal layer and usually parallel. The first-signal second line segment and the second-signal second line segment are in a second signal layer and usually parallel, wherein the first signal layer and the second signal layer are two layers of multiple layers of an integrated circuit or a circuit board. The first-signal third line segment and the second-signal third line segment are in the first signal layer and usually parallel. One end of the first-signal second line segment is coupled with the first-signal first line segment through a via while the other end of the first-signal second line segment is coupled with the first-signal third line segment through another via. Similarly, one end of the second-signal second line segment is coupled with the second-signal first line segment through a via while the other end of the second-signal second line segment is coupled with the second-signal third line segment through another via.

Regarding the first embodiment, the third signal trace includes a third-signal first line segment, a third-signal second line segment, and a third-signal third line segment in sequence along the transmission direction of the third signal; and the fourth signal trace includes a fourth-signal first line segment, a fourth-signal second line segment, and a fourth-signal third line segment in sequence along the transmission direction of the fourth signal. The third-signal first line segment and the fourth-signal first line segment are in the first signal layer and usually parallel. The third-signal second line segment and the fourth-signal second line segment are in the first signal layer and usually parallel, wherein the third-signal first line segment and the third-signal second line segment as a whole is not straight, and the fourth-signal first line segment and the fourth-signal second line segment as a whole is not straight. The third-signal third line segment and the fourth-signal third line segment are in the first signal layer and usually parallel. Any two line segments of the first-signal first line segment, the second-signal first line segment, the third-signal first line segment, and the fourth-signal first line segment are not crossed and usually parallel. Each of the first-signal second line segment and the second-signal second line segment crosses over each of the third-signal second line segment and the fourth-signal second line segment. Any two line segments of the first-signal third line segment, the second-signal third line segment, the third-signal third line segment, and the fourth-signal third line segment are not crossed and usually parallel.

A second embodiment of the layout of signal traces of the present disclosure includes a first set of signal traces and a second set of signal traces. The first set of signal traces and the second set of signal traces are used for transmitting a first differential signal and a second differential signal respectively. Each set of the first set of signal traces and the second set of signal traces includes a first part, a second part, and a third part in sequence along a direction of signal transmission, and the first part, the second part, and the third part are not on a straight line. The first part of the first set of signal traces and the first part of the second set of signal traces are in a first signal layer and usually parallel. The second part of the first set of signal traces and the second part of the second set of signal traces are in a second signal layer and the first signal layer respectively and are crossed, wherein the first signal layer and the second signal layer are two layers of multiple layers of an integrated circuit or a circuit board. The second part of the first set of signal traces are coupled between the first part of the first set of signal traces and the third part of the first set of signal traces through vias or interlayer conductors. The second part of the second set of signal traces are coupled between the first part of the second set of signal traces and the third part of the second set of signal traces. The third part of the first set of signal traces and the third part of the second set of signal traces are in the first signal layer and usually parallel.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 2b shows the line segments of every signal trace in FIG. 2a.
FIG. 3 shows a modification of the embodiment of FIG. 2a.
FIG. 4 shows a modification of the embodiment of FIG. 2a.

DETAILED DESCRIPTION OF THE PREFERRED EMBODIMENTS

The present specification discloses a layout of signal traces applicable to the transmission of multiphase signals and capable of reducing radiation interference.

Figure 2A:
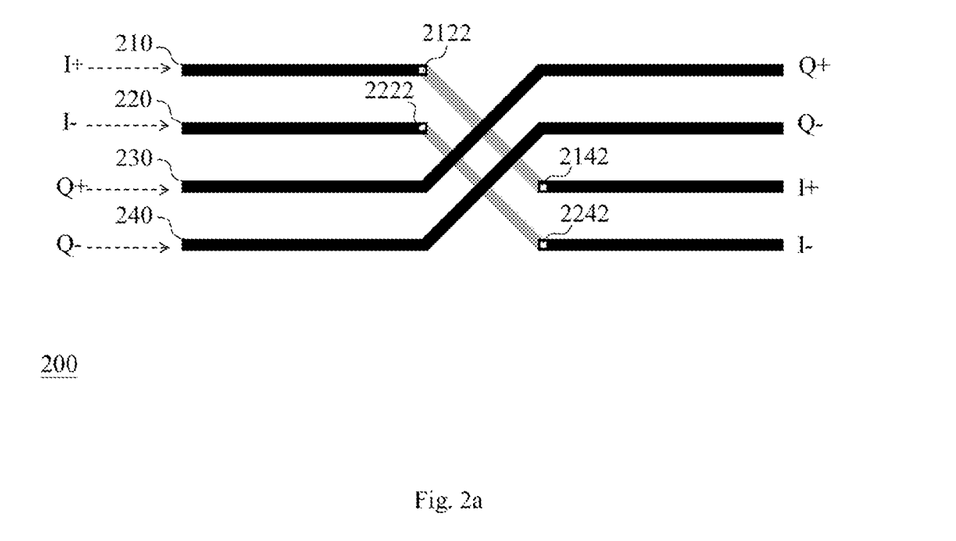
FIG. 2a shows an embodiment of the layout of signal traces of the present disclosure.

FIG. 2a shows an embodiment of the layout of signal traces of the present disclosure. The layout 200 of FIG. 2a includes a first set of signal traces and a second set of signal traces. The first set of signal traces includes a first signal trace 210 and a second signal trace 220 which are used for transmitting a first signal I+ and a second signal I− respectively. The first signal I+ and the second signal I− jointly form a first differential signal. The second set of signal traces includes a third signal trace 230 and a fourth signal trace 240 which are used for transmitting a third signal Q+ and a fourth signal Q− respectively. The third signal Q+ and the fourth signal Q− jointly form a second differential signal which is different from the first differential signal. In an exemplary implementation, the first signal I+ is equivalent to a received signal having a phase angle of 0 degree, the second signal I− is equivalent to the received signal having a phase angle of 180 degrees, the third signal is equivalent to the received signal having a phase angle of 90 degrees, and the fourth signal is equivalent to the received signal having a phase angle of 270 degrees; however, the implementation of the present invention is not limited thereto.

Figure 2B:
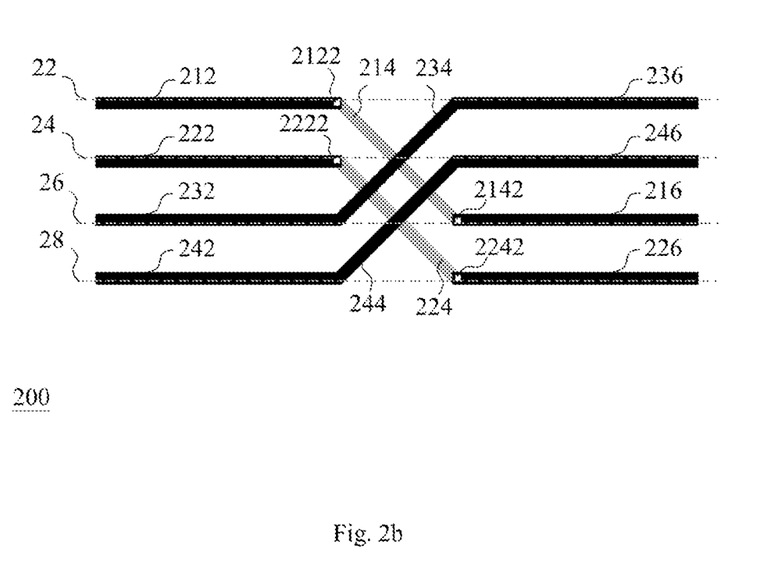

FIG. 2b shows the line segments of every signal trace in FIG. 2a. Referring to FIGS. 2a~'2b, the first signal trace 210 includes a first-signal first line segment 212, a first-signal second line segment 214, and a first-signal third line segment 216 in sequence along the transmission direction of the first signal I+; and the second signal trace 220 includes a second-signal first line segment 222, a second-signal second line segment 224, and a second-signal third line segment 226 in sequence along the transmission direction of the second signal I−. The first-signal first line segment 212 and the second-signal first line segment 222 are in a first signal layer (not shown in the figures) and can be parallel or not parallel. The first-signal second line segment 214 and the second-signal second line segment 224 are in a second signal layer (not shown in the figures) and can be parallel or not parallel. The first signal layer and the second signal layer are two layers of multiple layers of an integrated circuit (IC) or a circuit board, and the first signal layer can be above or below the second signal layer. The first-signal third line segment 216 and the second-signal third line segment 226 are in the first signal layer and can be parallel or not parallel. The first-signal first line segment 212 is coupled with the first-signal second line segment 214 through a via/interlayer-conductor 2122 while the first-signal second line segment 214 is coupled with the first-signal third line segment 216 through another via/interlayer-conductor 2142. The second-signal first line segment 222 is coupled with the second-signal second line segment 224 through a via/interlayer-conductor 2222 while the second-signal second line segment 224 is coupled with the second-signal third line segment 226 through another via/interlayer-conductor 2242. It is noted that in FIGS. 2a~2b the line segments in the first signal layer are shown in dark color (i.e., black), the line segments in the second signal layer are shown in light color (i.e., gray), and the vias/interlayer-conductors are shown in the form of small white blocks. It is also noted that the vias/interlayer-conductors in FIGS. 2a~2b can be realized with a conventional/self-developed means.

Referring to FIGS. 2a~'2b, the third signal trace 230 includes a third-signal first line segment 232, a third-signal second line segment 234, and a third-signal third line segment 236 in sequence along the transmission direction of the third signal Q+; and the fourth signal trace 240 includes a fourth-signal first line segment 242, a fourth-signal second line segment 244, and a fourth-signal third line segment 246 in sequence along the transmission direction of the fourth signal Q−. The third-signal first line segment 232 and the fourth-signal first line segment 242 are in the first signal layer and can be parallel or not parallel. The third-signal second line segment 234 and the fourth-signal second line segment 244 are in the first signal layer and can be parallel or not parallel. The third-signal third line segment 236 and the fourth-signal third line segment 246 are in the first signal layer and can be parallel or not parallel. It is noted that the third-signal first line segment 232, the third-signal second line segment 234, and the third-signal third line segment 236 as a whole is not straight, and the fourth-signal first line segment 242, the fourth-signal second line segment 244, and the fourth-signal third line segment 246 as a whole is not straight.

Referring to FIGS. 2a~'2b, any two line segments of the first-signal first line segment 212, the second-signal first line segment 222, the third-signal first line segment 232, and the fourth-signal first line segment 242 are not crossed and are usually parallel. Each of the first-signal second line segment 214 and the second-signal second line segment 224 crosses over each of the third-signal second line segment 234 and the fourth-signal second line segment 244. Any two line segments of the first-signal third line segment 216, the second-signal third line segment 226, the third-signal third line segment 236, and the fourth-signal third line segment 246 are not crossed and are usually parallel.

Referring to FIGS. 2a~2b, in the first signal layer the first-signal first line segment 212 and the third-signal third line segment 236 are on the same straight line 22; the second-signal first line segment 222 and the fourth-signal third line segment 246 are on the same straight line 24; the third-signal first line segment 232 and the first-signal third line segment 216 is on the same straight line 26; and the fourth-signal first line segment 242 and the second-signal third line segment 226 are on the same straight line 28. The above-mentioned straight lines 22, 24, 26, and 28 are virtual lines for defining the layout of signal traces, and are not physical lines. It is noted that in FIGS. 2a~2b any first line segment and any third line segment can be on the same straight line or on different straight lines, if practicable.

Referring to FIGS. 2a~2b, when the layout 200 of signal traces is applied to a radio frequency (RF) receiver, the layout 200 can effectively mitigate the interference from the harmonic signal(s) having the frequency 2×LO, but the application of the present invention is not limited thereto. The above-mentioned harmonic signal(s) are originated from a local oscillator of the RF receiver.

Figure 3:
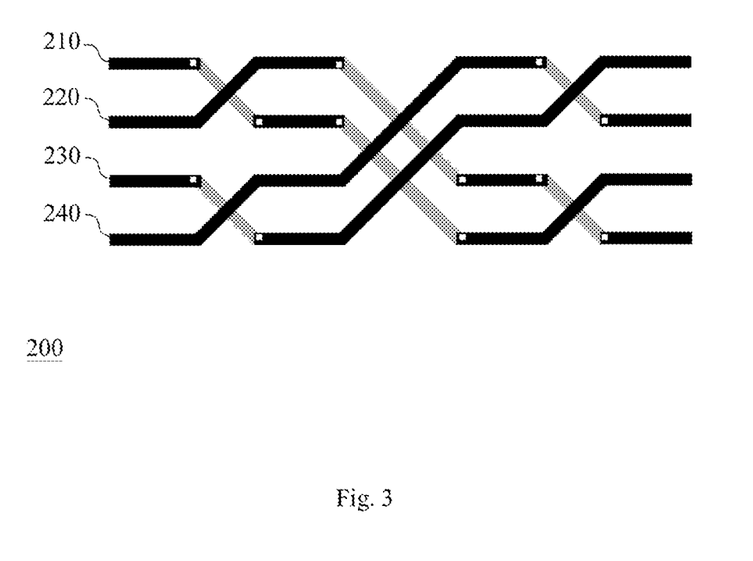

FIG. 3 shows a modification of the embodiment of FIG. 2a. As shown in FIG. 3: in the first crossing region, the first signal trace 210 and the second signal trace 220 are across each other and the third signal trace 230 and the fourth signal trace 240 are across each other; in the middle crossing region, the first set of signal traces 210, 220 crosses over the second set of signal traces 230, 240; in the last crossing region, the first signal trace 210 and the second signal trace 220 are across each other again and the third signal trace 230 and the fourth signal trace 240 are across each other again. It is noted that in FIG. 3 any two line segments being across each other are in different signal layers, wherein the line segment in the second signal layer is shown in gray. It is also noted that in FIG. 3 line segments of the same signal trace in different signal layers are coupled together by vias/interlayer-conductors (i.e., the white small blocks at the turnings of each signal trace in FIG. 3). When the layout 200 of signal traces of FIG. 3 is applied to an RF receiver, the layout 200 can effectively mitigate the interference from the aforementioned harmonic signal having the frequency 2×LO and mitigate the interference from the oscillation signal having the frequency LO, but the application of the present invention is not limited thereto.

Figure 4:
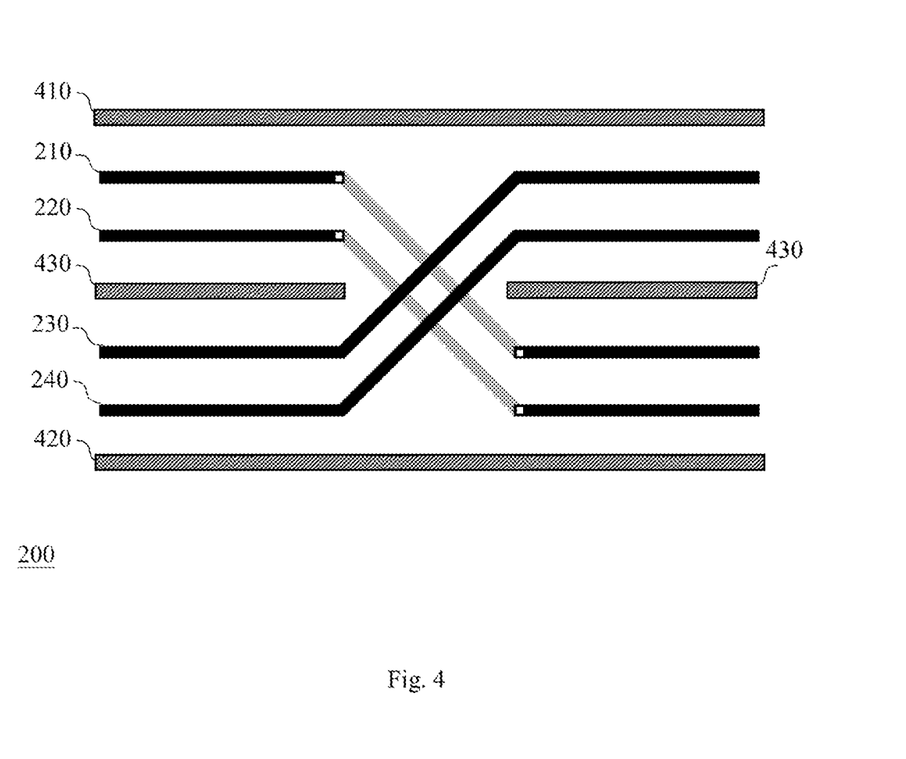

FIG. 4 shows a modification of the embodiment of FIG. 2a. As shown in FIG. 4, in the first signal layer the first set of signal traces 210, 220 and the second set of signal traces 230, 240 are between a shielding structure 410 and another shielding structure 420, and the first set of signal traces 210, 220 and the second set of signal traces 230, 240 are separated by a discrete shielding structure 430. These shielding structures 410, 420, and 430 are in the first signal layer for reducing mutual interference. In an exemplary implementation, each of the shielding structures 410, 420, and 430 is a grounding trace, but the implementation of the present invention is not limited thereto. In an exemplary implementation, a shielding structure (not shown in the figures) is set between two line segments being in different signal layers. In an exemplary implementation, a shielding structure (not shown in the figures) is set above or below the first/second signal layer. It is noted that in FIG. 4 line segments of the same signal trace in the different signal layers are coupled together by vias or interlayer-conductors (i.e., the white small blocks at the turnings of the signal traces 210 and 220 in FIG. 4).

Another embodiment of the layout of signal traces of the present disclosure includes a first set of signal traces and a second set of signal traces. The first set of signal traces and the second set of signal traces are used for transmitting a first differential signal and a second differential signal respectively. Each set of the first set of signal traces and the second set of signal traces includes a first part, a second part, and a third part in sequence along a direction of signal transmission, and the first part, the second part, and the third part as a whole is not straight. The first part of the first set of signal traces and the first part of the second set of signal traces are in a first signal layer and are usually parallel. The second part of the first set of signal traces and the second part of the second set of signal traces are in a second signal layer and the first signal layer respectively and are crossed, wherein the first signal layer and the second signal layer are two layers of multiple layers of an integrated circuit or a circuit board. The second part of the first set of signal traces are coupled between the first part of the first set of signal traces and the third part of the first set of signal traces through vias or interlayer-conductors. The second part of the second set of signal traces are coupled between the first part of the second set of signal traces and the third part of the second set of signal traces. The third part of the first set of signal traces and the third part of the second set of signal traces are in the first signal layer and are usually parallel.

Since those having ordinary skill in the art can appreciate the detail and the modification of the above embodiment by referring to the embodiments of FIGS. 2a~4, repeated and redundant description is omitted here.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

To sum up, the layout of signal traces of the present disclosure is applicable to the transmission of multiphase signals and capable of reducing radiation interference.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A layout of signal traces applicable to transmission of signals having different phases and capable of reducing mutual interference, the layout of signal traces comprising:
   a first set of signal traces including a first signal trace and a second signal trace, wherein:
   the first signal trace and the second signal trace are used for transmitting a first signal and a second signal respectively, and the first signal and the second signal jointly form a first differential signal;
   the first signal trace includes a first-signal first line segment, a first-signal second line segment, and a first-signal third line segment in sequence along a transmission direction of the first signal;
   the second signal trace includes a second-signal first line segment, a second-signal second line segment, and a second-signal third line segment in sequence along a transmission direction of the second signal;
   the first-signal first line segment and the second-signal first line segment are in a first signal layer;
   the first-signal second line segment and the second-signal second line segment are in a second signal layer, and the first signal layer and the second signal layer are two layers of multiple layers of an integrated circuit or a circuit board;
   the first-signal third line segment and the second-signal third line segment are in the first signal layer;
   the first-signal first line segment is coupled with the first-signal second line segment through a first-signal first via, and the first-signal second line segment is coupled with the first-signal third line segment through a first-signal second via; and the second-signal first line segment is coupled with the second-signal second line segment through a second-signal first via, and the second-signal second line segment is coupled with the second-signal third line segment through a second-signal second via; and a second set of signal traces including a third signal trace and a fourth signal trace, wherein:

the third signal trace and the fourth signal trace are used for transmitting a third signal and a fourth signal respectively, and the third signal and the fourth signal jointly form a second differential signal that is different from the first differential signal;

the third signal trace includes a third-signal first line segment, a third-signal second line segment, and a third-signal third line segment in sequence along a transmission direction of the third signal;

the fourth signal trace includes a fourth-signal first line segment, a fourth-signal second line segment, and a fourth-signal third line segment in sequence along a transmission direction of the fourth signal;

the third-signal first line segment and the fourth-signal first line segment are in the first signal layer;

the third-signal second line segment and the fourth-signal second line segment are in the first signal layer, the third-signal first line segment and the third-signal second line segment as a whole is not straight, and the fourth-signal first line segment and the fourth-signal second line segment as a whole is not straight;

the third-signal third line segment and the fourth-signal third line segment are in the first signal layer;

any two line segments of the first-signal first line segment, the second-signal first line segment, the third-signal first line segment, and the fourth-signal first line segment are not crossed;

each of the first-signal second line segment and the second-signal second line segment crosses over each of the third-signal second line segment and the fourth-signal second line segment; and any two line segments of the first-signal third line segment, the second-signal third line segment, the third-signal third line segment, and the fourth-signal third line segment are not crossed, wherein:

the third signal trace includes a third-signal fourth line segment, a third-signal fifth line segment, the third-signal first line segment, the third-signal second line segment, and the third-signal third line segment in sequence along the transmission direction of the third signal;

the fourth signal trace includes a fourth-signal fourth line segment, a fourth-signal fifth line segment, the fourth-signal first line segment, the fourth-signal second line segment, and the fourth-signal third line segment in sequence along the transmission direction of the fourth signal;

the third-signal fourth line segment and the fourth-signal fourth line segment are in the first signal layer;

the third-signal fifth line segment is in the second signal layer, the fourth-signal fifth line segment is in the first line segment, and the third-signal fifth line segment crosses over the fourth-signal fifth line segment;

the third-signal fourth line segment is coupled with the third-signal fifth line segment through a third-signal first via, and the third-signal fifth line segment is coupled with the third-signal first line segment through a third-signal second via; and the fourth-signal fifth line segment is coupled between the fourth-signal fourth line segment and the fourth-signal first line segment.

2. The layout of signal traces of claim 1, wherein the first signal is equivalent to a received signal having a phase angle of 0 or 180 degrees, and the third signal is equivalent to the received signal having a phase angle of 90 or 270 degrees.

3. The layout of signal traces of claim 1, wherein the first-signal first line segment is on a first straight line, and the first-signal third line segment is not on the first straight line; the second-signal first line segment is on a second straight line, and the second-signal third line segment is not on the second straight line; the third-signal first line segment is on a third straight line, and the third-signal third line segment is not on the third straight line; the fourth-signal first line segment is on a fourth straight line, and the fourth-signal third line segment is not on the fourth straight line; and the first straight line, the second straight line, the third straight line, and the fourth straight line are four different virtual straight lines for defining a layout of signal line segments.

4. The layout of signal traces of claim 3, wherein the first-signal third line segment is on the third straight line, the second-signal third line segment is on the fourth straight line, the third-signal third line segment is on the first straight line, and the fourth-signal third line segment is on the second straight line.

5. A layout of signal traces applicable to transmission of signals having different phases and capable of reducing mutual interference, the layout of signal traces comprising:

a first set of signal traces including a first signal trace and a second signal trace, wherein:

the first signal trace and the second signal trace are used for transmitting a first signal and a second signal respectively, and the first signal and the second signal jointly form a first differential signal;

the first signal trace includes a first-signal first line segment, a first-signal second line segment, and a first-signal third line segment in sequence along a transmission direction of the first signal;

the second signal trace includes a second-signal first line segment, a second-signal second line segment, and a second-signal third line segment in sequence along a transmission direction of the second signal;

the first-signal first line segment and the second-signal first line segment are in a first signal layer;

the first-signal second line segment and the second-signal second line segment are in a second signal layer, and the first signal layer and the second signal layer are two layers of multiple layers of an integrated circuit or a circuit board;

the first-signal third line segment and the second-signal third line segment are in the first signal layer;

the first-signal first line segment is coupled with the first-signal second line segment through a first-signal first via, and the first-signal second line segment is coupled with the first-signal third line segment through a first-signal second via; and the second-signal first line segment is coupled with the second-signal second line segment through a second-signal first via, and the second-signal second line segment is coupled with the second-signal third line segment through a second-signal second via; and a second set of signal traces including a third signal trace and a fourth signal trace, wherein:

the third signal trace and the fourth signal trace are used for transmitting a third signal and a fourth signal respectively, and the third signal and the fourth signal jointly form a second differential signal that is different from the first differential signal;

the third signal trace includes a third-signal first line segment, a third-signal second line segment, and a third-signal third line segment in sequence along a transmission direction of the third signal;

the fourth signal trace includes a fourth-signal first line segment, a fourth-signal second line segment, and a fourth-signal third line segment in sequence along a transmission direction of the fourth signal;

the third-signal first line segment and the fourth-signal first line segment are in the first signal layer;

the third-signal second line segment and the fourth-signal second line segment are in the first signal layer, the third-signal first line segment and the third-signal second line segment as a whole is not straight, and the fourth-signal first line segment and the fourth-signal second line segment as a whole is not straight;

the third-signal third line segment and the fourth-signal third line segment are in the first signal layer;

any two line segments of the first-signal first line segment, the second-signal first line segment, the third-signal first line segment, and the fourth-signal first line segment are not crossed;

each of the first-signal second line segment and the second-signal second line segment crosses over each of the third-signal second line segment and the fourth-signal second line segment; and any two line segments of the first-signal third line segment, the second-signal third line segment, the third-signal third line segment, and the fourth-signal third line segment are not crossed, wherein:

the third signal trace includes the third-signal first line segment, the third-signal second line segment, the third-signal third line segment, a third-signal fourth line segment, and a third-signal fifth line segment in sequence along the transmission direction of the third signal;

the fourth signal trace includes the fourth-signal first line segment, the fourth-signal second line segment, the fourth-signal third line segment, a fourth-signal fourth line segment, and a fourth-signal fifth line segment in sequence along the transmission direction of the fourth signal;

the third-signal fourth line segment is in the second signal layer, the fourth-signal fourth line segment is in the first signal layer, and the third-signal fourth line segment crosses over the fourth-signal fourth line segment;

the third-signal fifth line segment and the fourth-signal fifth line segment are in the first signal layer;

an end of the third-signal fourth line segment is coupled with the third-signal third line segment through a first-signal first via, and another end of the third-signal fourth line segment is coupled with the third-signal fifth line segment through a third-signal second via; and the fourth-signal fourth line segment is coupled between the fourth-signal third line segment and the fourth-signal fifth line segment.

6. The layout of signal traces of claim 1, further comprising a first shielding structure and a second shielding structure, wherein in the first signal layer the first set of signal traces and the second set of signal traces are between the first shielding structure and the second shielding structure.

7. The layout of signal traces of claim 6, wherein each of the first shielding structure and the second shielding structure is a grounding trace.

8. The layout of signal traces of claim 1, further comprising: a shielding structure positioned between the first set of signal traces and the second set of signal traces in the first signal layer.

9. The layout of signal traces of claim 8, wherein the shielding structure includes a first grounding trace and a second grounding trace; the first grounding trace is between the second-signal first line segment and the third-signal first line segment; and the second grounding trace is between the second-signal third line segment and the third-signal third line segment.

10. The layout of signal traces of claim 1, further comprising: a shielding structure positioned between at least a part of the first set of signal traces and at least a part of the second set of signal traces.

11. A layout of signal traces comprising a first set of signal traces and a second set of signal traces, wherein:

each set of the first set of signal traces and the second set of signal traces includes a first part, a second part, and a third part in sequence along a direction of signal transmission, and the first part, the second part, and the third part as a whole is not straight;

the first part of the first set of signal traces and the first part of the second set of signal traces are in a first signal layer;

the second part of the first set of signal traces and the second part of the second set of signal traces are in a second signal layer and the first signal layer respectively and are crossed, and the first signal layer and the second signal layer are two layers of multiple layers of an integrated circuit or a circuit board;

the second part of the first set of signal traces are coupled between the first part of the first set of signal traces and the third part of the first set of signal traces through vias or interlayer-conductors;

the second part of the second set of signal traces are coupled between the first part of the second set of signal traces and the third part of the second set of signal traces; and the third part of the first set of signal traces and the third part of the second set of signal traces are in the first signal layer, wherein:

the first set of signal traces and the second set of signal traces are used for transmitting a first differential signal and a second differential signal respectively; and the first differential signal is composed of a first signal and a second signal; the second differential signal is composed of a third signal and a fourth signal; the third signal is a quadrature-phase signal with respect to the first signal; and the fourth signal is a quadrature-phase signal with respect to the second signal.

* * * * *